United States Patent [19]

Kuruma et al.

[11] Patent Number: 5,024,900

[45] Date of Patent: Jun. 18, 1991

[54] COMPOSITE NICKEL-PHOSPHORUS ALLOY PLATED METAL SHEET EXCELLENT IN STRIPPABILITY AND HAVING HIGH HARDNESS AND METHOD FOR MANUFACTURING SAME

[75] Inventors: Kiyoshi Kuruma; Masaki Abe; Hiroshi Kagechika; Shinichi Kagaya, all of Tokyo, Japan

[73] Assignee: NKK Corporation, Tokyo, Japan

[21] Appl. No.: 599,152

[22] Filed: Oct. 17, 1990

[30] Foreign Application Priority Data

Apr. 26, 1990 [JP] Japan .................................. 2-111478

[51] Int. Cl.⁵ ............................................. B32B 15/08
[52] U.S. Cl. ................................ 428/626; 204/44.7; 428/457; 428/480; 428/653; 428/684
[58] Field of Search ............... 428/457, 480, 653, 626, 428/684; 204/44.7

[56] References Cited

U.S. PATENT DOCUMENTS 4,194,040  3/1980  Breton et al. ........................ 428/308
4,497,877  2/1985  Krijl et al. ............................ 428/628

FOREIGN PATENT DOCUMENTS 60-10816  4/1985  Japan .

Primary Examiner—Stephen J. Lechert, Jr.
Assistant Examiner—Nigohosian, Jr. Leon
Attorney, Agent, or Firm—Frishauf, Holtz, Goodman & Woodward

[57] ABSTRACT

A composite nickel-phosphorus alloy plated metal sheet excellent in strippability and having a Vickers hardness of at least 500 Hv, which comprises: a composite nickel-phosphorus alloy plating layer as a lower layer, formed on at least one surface of a metal sheet, in which $Ni_3P$ particles and fluorocarbon polymer particles are uniformly dispersed; and a fluorocarbon polymer layer as an upper layer formed by melting the fluorocarbon polymer particles which are exposed on the surface of the composite nickel-phosphorus alloy plating layer as the lower layer. The sum of a phosphorus content in the composite nickel-phosphorus alloy plating layer as the lower layer and a phosphorus content in the $Ni_3P$ particles is from 1 to 15 wt. % relative to the composite nickel-phosphorus alloy plating layer as the lower layer, and a content of the fluorocarbon polymer particles in the composite nickel-phosphorus alloy plating layer as the lower layer is from 0.3 to 15.2 wt. % relative to the composite nickel-phosphorus alloy plating layer as the lower layer.

7 Claims, 1 Drawing Sheet

COMPOSITE NICKEL-PHOSPHORUS ALLOY PLATED METAL SHEET EXCELLENT IN STRIPPABILITY AND HAVING HIGH HARDNESS AND METHOD FOR MANUFACTURING SAME

REFERENCE TO PATENTS, APPLICATIONS AND PUBLICATIONS PERTINENT TO THE INVENTION

As far as we know, there is available the following prior art document pertinent to the present invention: Japanese Utility Model Publication No. 60-10,816 dated Apr. 12, 1985.

The contents of the prior art disclosed in the above-mentioned prior art document will be discussed hereafter under the heading of the "BACKGROUND OF THE INVENTION".

FIELD OF THE INVENTION

The present invention relates to a composite nickel-phosphorus alloy plated metal sheet excellent in the property permitting stripping of an adhesive adhering onto the surface thereof (hereinafter referred to as "strippability") and having a Vickers hardness of at least 500 Hv, and a method for manufacturing same.

BACKGROUND OF THE INVENTION

A printed circuit board widely used in an electronic implement comprises, for example, a synthetic resin sheet and a sheet of copper foil bonded onto each of the both surfaces of the synthetic resin board through a glass fiber sheet impregnated with an epoxy resin (hereinafter referred to as the "prepreg").

A typical method for manufacturing a printed circuit board is described with reference to FIG. 1. FIG. 1 is a schematic descriptive view illustrating a method for simultaneously manufacturing a plurality of printed circuit boards by the use of a hot press.

First, a sheet of copper foil 9a, a prepreg 8a, a synthetic resin sheet 7, another prepreg 8b and another sheet of copper foil 9b are placed one on the top of the other in this order to prepare a set of laminated sheets 6a. Another set of laminated sheets 6b is prepared in the same manner as described above, and thus a plurality of sets of laminated sheets 6a and 6b are prepared.

The above-mentioned plurality of sets of laminated sheets 6a and 6b are arranged between a pair of pressing portions of a hot press 12, as shown in FIG. 1, i.e., between a lower pressing portion 14 provided on a stand 13, and an upper pressing portion 15 arranged upward the lower pressing portion 14 at a prescribed distance therebetween so as to face same, and are pressed at a prescribed temperature. For the purpose of uniformly pressing each of the plurality of sets of laminated sheets 6a and 6b, a pair of pressing plates made of steel, i.e., a lower pressing plate 10a and an upper pressing plate 10b, each having a thickness of about 5 to 10 mm, and a plurality of separating sheets made of steel, i.e., a lower separating sheet 11a, an intermediate separating sheet 11b and a lower separating sheet 11c, each having a thickness of about 1 to 2 mm, are employed.

A block is thus prepared by placing, from down to top in the following order, on the top of the other, the lower pressing plate 10a, the lower separating sheet 11a, the set of laminated sheets 6a, the intermediate separating sheet 11b, the other set of laminated sheets 6b, the upper separating sheet 11c and the upper pressing plate 10b. A plurality of through-holes 16, 17 are provided at prescribed points on the thus prepared block, and mutual slip between the components of the block is prevented by inserting pins (not shown) into these through-holes 16, 17.

The above-mentioned block is mounted on the lower pressing portion 14 equipped with a heater, provided on the stand 13 of the hot press 12. The hot press 12 is actuated in this state to cause the upper pressing portion 15 equipped with a heater to go down and thus to apply a pressure on the block at a prescribed temperature. As a result, the epoxy resin impregnated in each of the prepreg 8a and the other prepreg 8b is melted, and this causes the sheet of copper foil 9a and the other sheet of copper foil 9b to be respectively bonded onto the both surfaces of the synthetic resin sheet 7 in the set of laminated sheets 6a, thus forming a printed circuit board. A sheet of copper foil and another sheet of copper foil are also respectively bonded onto the both surfaces of a synthetic resin sheet in the other set of laminated sheets 6b in the same manner as described above, thus forming another printed circuit board.

After the completion of bonding of the sheet of copper foil 9a and the other sheet of copper foil 9b onto the both surfaces of the synthetic resin sheet 7, the hot press 12 is actuated to cause the upper pressing portion 15 to go up to release the pressure on the block, and thus to take out the block from the hot press 12. Then, the above-mentioned pins are removed from the block thus taken out, and the lower pressing plate 10a, the lower separating sheet 11a, the intermediate separating sheet 11b, the upper separating sheet 11c and the upper pressing plate 10b are removed from the block, thereby, simultaneously manufacturing a plurality of printed circuit boards.

The above-mentioned method for manufacturing a printed circuit board has the following problems; When applying a pressure onto the block by the use of the hot press 12 as described above, part of the melted epoxy resin between the synthetic resin sheet 7, the sheet of copper foil 9a and the other sheet of copper foil 9b is forced out from the edges of these sheets and from the through-holes 16, 17 inserted with the above-mentioned pins, and adheres onto the surfaces of the lower pressing plate 10a, the lower separating sheet 11a, the intermediate separating sheet 11b, the upper separating sheet 11c and the upper pressing plate 10b.

Adhesion of the epoxy resin onto the surfaces of the lower pressing plate 10a, the lower separating sheet 11a, the intermediate separating sheet 11b, the upper separating sheet 11c and the upper pressing plate 10b causes the following demerits:

(1) It becomes difficult to pull out the pins from the through-holes 16, 17 of the above-mentioned block;
(2) It becomes difficult to remove the lower pressing plate 10a, the lower separating sheet 11a, the intermediate separating sheet 11b, the upper separating sheet 11c and the upper pressing plate 10b from the block;
(3) When applying a pressure onto another block by means of the hot press 12 in the same manner as described above by the use of the lower separating sheet 11a, the intermediate separating sheet 11b and the upper separating sheet 11c , onto the surfaces of which the epoxy resin adheres, flaws are caused on the surface of the copper foil of the resultant printed circuit board by the epoxy resin adhering onto the surfaces of these separating sheets 11a, 11b and 11c.
(4) It is therefore necessary, after the use of the lower separating sheet 11a, the intermediate separating sheet 11b, and the upper separating sheet 11c, to always remove the epoxy resin adhering onto the surfaces of these separating sheets 11a, 11b and 11c by means of a metal spatula or a knife;

(5) However, the above-mentioned removing operation of the epoxy resin tends to cause flaws on the surfaces of the lower separating sheet 11a, the intermediate separating sheet 11b and the upper separating sheet 11c;

(6) When applying a pressure onto another block by means of the hot press 12 in the same manner as described above by the use of the lower separating sheet 11a, the intermediate separating sheet 11b and the upper separating sheet 11c, on the surfaces of which the above-mentioned flaws are produced, flaws are caused on the surface of the copper foil of the resultant printed circuit board by the flaws produced on the surfaces of these separating sheets 11a, 11b and 11c; and (7) It is therefore necessary to polish frequently the surfaces of the lower separating sheet 11a, the intermediate separating sheet 11b and the upper separating sheet 11c to smooth same. As a result, these separating sheets 11a, 11b and 11c lose the thickness thereof and the service lives thereof are reduced.

As a means to solve the above-mentioned problems, there is known a method for preventing adhesion of epoxy resin onto the surfaces of the lower separating sheet 11a, the intermediate separating sheet 11b and the upper separating sheet 11c by covering the surfaces of these separating sheets 11a, 11b and 11c with a fluorocarbon polymer film (hereinafter referred to as the "prior art 1").

However, the prior art 1 has the following defects:

(A) Each time a pressure is applied onto the block by the use of the hot press 12, it is necessary to replace the above-mentioned fluorocarbon polymer film with a new one, this resulting in more complicated operations and leading to a higher manufacturing cost; and (B) Even by using the above-mentioned fluorocarbon polymer film, it is impossible to completely prevent adhesion of the epoxy resin onto the surfaces of the lower separating sheet 11a, the intermediate separating sheet 11b and the upper separating sheet 11c. More specifically, it is necessary to form holes for inserting the above-mentioned pins also in the fluorocarbon polymer film, and as a result, the epoxy resin flows through the holes in the fluorocarbon polymer film, and the through-holes 16, 17 in these separating sheets 11a, 11b and 11c, and adheres onto the surfaces thereof.

Japanese Utility Model Publication No. 60-10,816 dated Apr. 12, 1985 discloses a mold for forming plastics, rubber or glass, which has on the inner surface thereof a plating layer in which fluorocarbon polymer particles are uniformly dispersed (hereinafter referred to as the "prior art 2").

The prior art 2 further discloses the following:

(a) The plating layer of the prior art 2 may comprise a nickel-phosphorus alloy; and (b) A fluorocarbon polymer layer may be formed, on the surface of the plating layer, by melting the fluorocarbon polymer particles which are exposed on the surface of the plating layer.

The lower separating sheet 11a, the intermediate separating sheet 11b and the upper separating onto the block by the use of the above-mentioned hot press 12, are required to have a Vickers hardness of at least 500 Hv. In the prior art 2, however, no regard is given to the effect of both the phosphorus content in the plating layer and the content of the fluorocarbon polymer particles in the plating layer, exerted on both hardness and strippability of the plating layer, in the case where the plating layer comprises a nickel-phosphorus alloy. In the prior art 2, as a result, it is not ensured that the plating layer is excellent in strippability and has a Vickers hardness of at least 500 Hv.

It is not therefore possible to apply the technical idea of the prior art 2 to the lower separating sheet 11a, the intermediate separating sheet 11b and the upper separating sheet 11c, which are used when applying the pressure onto the block by the use of the hot press 12. Even when the technical idea of the prior art 2 is applied to the lower separating sheet 11a, the intermediate separating sheet 11b and the upper separating sheet 11c to form a plating layer, in which the fluorocarbon polymer particles are uniformly dispersed, on the surfaces of these separating sheets 11a, 11b and 11c, it is not ensured that the thus obtained separating sheets simultaneously satisfy the following two conditions: (1) The separating sheets are excellent in strippability, i.e., they have a strippability sufficient to permit easy removal of the epoxy resin adhering onto the surfaces of the separating sheets by means of a metal spatula or a knife; and (2) The separating sheets have a sufficient hardness, i.e., a Vickers hardness of at least 500 Hv.

Therefore, if the thus obtained separating sheets are used when applying the pressure onto the block by the use of the hot press 12, the following problems may be caused: (a) It is difficult to completely remove the epoxy resin adhering onto the surfaces of the separating sheets even with the use of a metal spatula or a knife; and (b) During the above-mentioned removing operation of the epoxy resin, the metal spatula or the knife may cause deep flaws in the plating layer, and moreover, may cause flaws, not only in the plating layer, but also in the substrate itself, and such flaws in the plating layer and the substrate degrade the quality of the printed circuit board, as described above.

Under such circumstances, there is a strong demand for the development of a composite nickel-phosphorus alloy plated metal sheet excellent in strippability and having a Vickers hardness of at least 500 Hv, which is most suitable as a separating sheet to be used when manufacturing a printed circuit board by the use of a hot press, but such a composite nickel-phosphorus alloy plated metal sheet and a method for manufacturing same have not as yet been proposed.

SUMMARY OF THE INVENTION

An object of the present invention is therefore to provide a composite nickel-phosphorus alloy plated metal sheet excellent in strippability and having a Vickers hardness of at least 500 Hv, which is most suitable as a separating sheet to be used when manufacturing a printed circuit board by the use of a hot press, and a method for manufacturing same.

In accordance with one of the features of the present invention, there is provided a composite nickel-phosphorus alloy plated metal sheet excellent in strippability and having a Vickers hardness of at least 500 Hv, which comprises:

a composite nickel-phosphorus alloy plating layer as a lower layer, formed on at least one surface of a metal sheet, in which $Ni_3P$ particles and fluorocarbon polymer particles are uniformly dispersed, the sum of a phosphorus content in the matrix of said composite nickel-phosphorus alloy plating layer as the lower layer and a phosphorus content in said $Ni_3P$ particles being within a range of from 1 to 15 wt. % relative to said composite nickel-phosphorus alloy plating layer as the lower layer, and a content of said fluorocarbon polymer particles in said composite nickel-phosphorus alloy plating layer as the lower layer being within a range of from 0.3 to 15.2 wt. % relative to said composite nickel-phosphorus alloy plating layer as the lower layer; and a fluorocarbon polymer layer as an upper layer, formed, on said composite nickel-phosphorus alloy plating layer as the lower layer, by melting said fluorocarbon polymer particles which are exposed on the surface of said composite nickel-phosphorus alloy plating layer as the lower layer.

Furthermore, in accordance with another one of the features of the present invention, there is provided a method for manufacturing a composite nickel-phosphorus alloy plated metal sheet excellent in strippability and having a Vickers hardness of at least 500 Hv, which comprises the steps of:

electroplating a metal sheet in a composite nickel electroplating bath containing phosphorus acid in an amount of from 5 to 50 g/l and fluorocarbon polymer particles in an amount of from 1 to 50 g/l, to form, on at least one surface of said metal sheet, a composite nickel-phosphorus alloy plating layer as a lower layer, in which said fluorocarbon polymer particles are uniformly dispersed; and then heating said metal sheet having said composite nickel-phosphorus alloy plating layer as the lower layer thus formed on said at least one surface of said metal sheet to a temperature within a range of from 325° to 400° C. for a period of time of from 10 minutes to 3 hours, to melt said fluorocarbon polymer particles which are exposed on a surface of said composite nickel-phosphorus alloy plating layer as the lower layer so as to form a fluorocarbon polymer layer as an upper layer on said composite nickel-phosphorus alloy plating layer as the lower layer; and simultaneously, to cause at least part of nickel in said composite nickel-phosphorus alloy plating layer as the lower layer to react with at least part of phosphorus in said composite nickel-phosphorus alloy plating layer as the lower layer to cause precipitation of $Ni_3P$ particles so as to uniformly disperse the thus precipitated $Ni_3P$ particles together with said fluorocarbon polymer particles into said composite nickel-phosphorus alloy plating layer as the lower layer; thereby manufacturing said composite nickel-phosphorus alloy plated metal sheet comprising said composite nickel-phosphorus alloy plating layer as the lower layer, formed on said at least one surface of said metal sheet, in which said $Ni_3P$ particles and said fluorocarbon polymer particles are uniformly dispersed, and said fluorocarbon polymer layer as the upper layer formed on said composite nickel-phosphorus alloy plating layer as the lower layer.

DETAILED DESCRIPTION OF PREFERRED EMBODIMENTS

From the above-mentioned point of view, extensive studies were carried out to develop a composite nickel-phosphorus alloy plated metal sheet excellent in strippability and having a Vickers hardness of at least 500 Hv, which is most suitable as a separating sheet to be used when manufacturing a printed circuit board by the use of a hot press, and a method for manufacturing same.

As a result, the following findings were obtained: It is possible to manufacture a composite nickel-phosphorus alloy plated metal sheet excellent in strippability and having a Vickers hardness of at least 500 Hv, by electroplating a metal sheet in a composite nickel electroplating bath containing phosphorous acid in an amount of from 5 to 50 g/l and fluorocarbon polymer particles in an amount of from 1 to 50 g/l, to form, on at least one surface of said metal sheet, a composite nickel-phosphorus alloy plating layer as a lower layer, in which said fluorocarbon polymer particles are uniformly dispersed; and then heating said metal sheet having said composite nickel-phosphorus alloy plating layer as the lower layer thus formed on said at least one surface of said metal sheet to a temperature within a range of from 325° to 400° C. for a period of time of from 10 minutes to 3 hours, to melt said fluorocarbon polymer particles which are exposed on a surface of said composite nickel-phosphorus alloy plating layer as the lower layer so as to form a fluorocarbon polymer layer as an upper layer on said composite nickel-phosphorus alloy plating layer as the lower layer; and simultaneously, to cause at least part of nickel in said composite nickel-phosphorus alloy plating layer as the lower layer to react with at least part of phosphorus in said composite nickel-phosphorus alloy plating layer as the lower layer to cause precipitation of $Ni_3P$ particles so as to uniformly disperse the thus precipitated $Ni_3P$ particles together with said fluorocarbon polymer particles into said composite nickel-phosphorus alloy plating layer as the lower layer; thereby manufacturing said composite nickel-phosphorus alloy plated metal sheet excellent in strippability and having a Vickers hardness of at least 500 Hv, which comprises said composite nickel-phosphorus alloy plating layer as the lower layer, formed on said at least one surface of said metal sheet, in which said $Ni_3P$ particles and said fluorocarbon polymer particles are uniformly dispersed, and said fluorocarbon polymer layer as the upper layer formed on said composite nickel-phosphorus alloy plating layer as the lower layer.

The present invention was made on the basis of the above-mentioned findings. The composite nickel-phosphorus alloy plated metal sheet excellent in strippability and having a Vickers hardness of at least 500 Hv and the method for manufacturing same of the present invention are described below with reference to the drawings.

Figure 1:
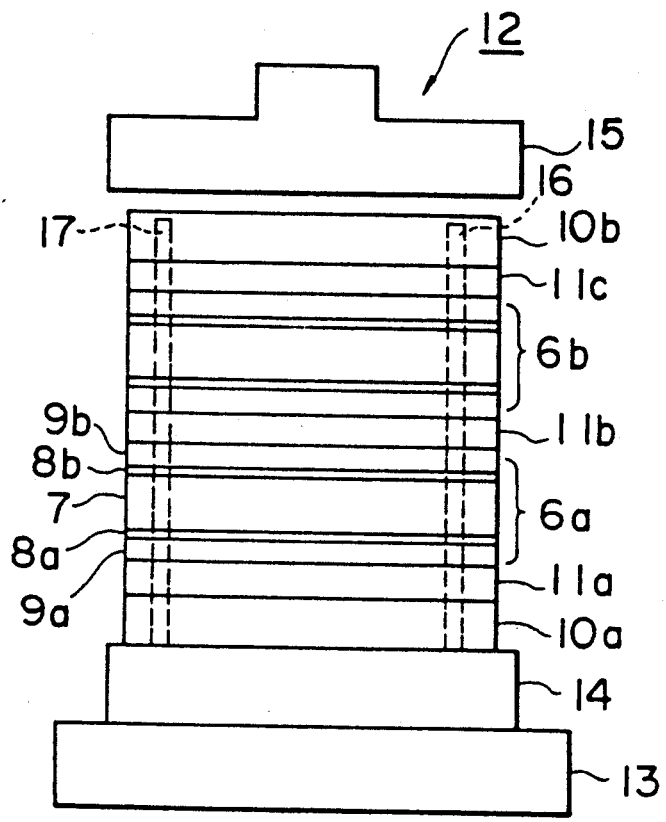
FIG. 1 is a schematic descriptive view illustrating a conventional method for simultaneously manufacturing a plurality of printed circuit boards by the use of a hot press.
Figure 2:
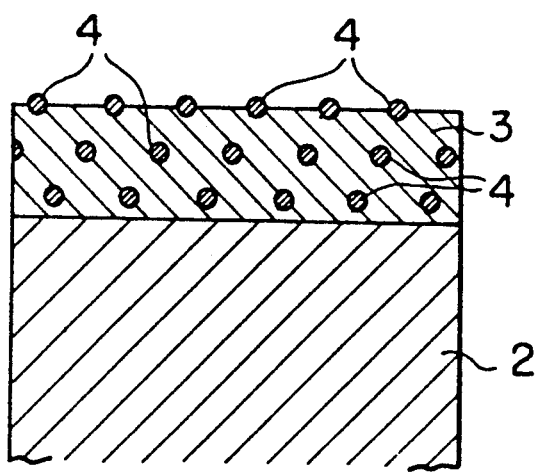
FIG. 2 is a schematic partial vertical sectional view illustrating a composite nickel-phosphorus alloy plating layer as a lower layer formed on the surface of a metal sheet in accordance with the first step of the method of the present invention.
Figure 3:
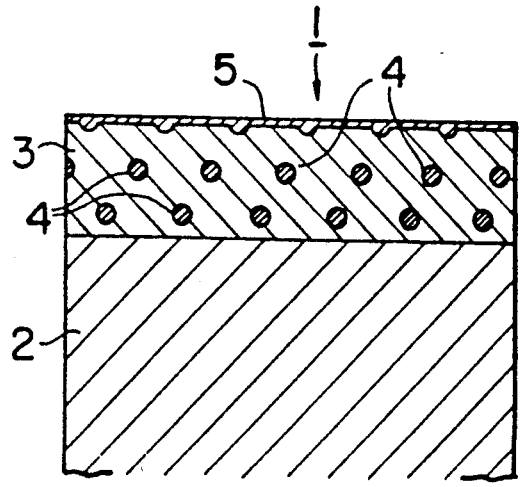
FIG. 3 is a schematic partial vertical sectional view illustrating a fluorocarbon polymer layer as an upper layer, formed, on the composite nickel-phosphorus alloy plating layer as the lower layer, by melting fluorocarbon polymer particles which are exposed on the surface of the composite nickel-phosphorus alloy plating layer as the lower layer in accordance with the second step of the method of the present invention.

FIG. 2 is a schematic partial vertical sectional view illustrating a composite nickel-phosphorus alloy plating layer as a lower layer formed on the surface of a metal sheet in accordance with the first step of the method of the present invention; and FIG. 3 is a schematic partial vertical sectional view illustrating a fluorocarbon polymer layer as an upper layer, formed, on the composite nickel-phosphorus alloy plating layer as the lower layer, by melting fluorocarbon polymer particles which are exposed on the surface of the composite nickel-phosphorus alloy plating layer as the lower layer in accordance with the second step of the method of the present invention.

As is clear from FIG. 3, a composite nickel-phosphorus alloy plated metal sheet 1 of the present invention comprises a composite nickel-phosphorus alloy plating layer 3 as a lower layer, formed on at least one surface of a metal sheet 2, in which $Ni_3P$ particles and fluorocarbon polymer particles 4 are uniformly dispersed, and a fluorocarbon polymer layer 5 as an upper layer, formed, on the composite nickel-phosphorus alloy plating layer 3 as the lower layer, by melting the fluorocarbon polymer particles 4 which are exposed on the surface of the composite nickel-phosphorus alloy plating layer 3 as the lower layer.

The metal sheet 2 comprises steel or an aluminum alloy. Grades of steel which may be used as the metal sheet 2 include, for example, machine structural carbon steel such as JIS S45C, ordinary structural steel such as JIS SS41, austenitic stainless steel such as JIS SUS201, ferritic stainless steel such as JIS SUS405; martensitic stainless steel such as JIS SUS403, and precipitation-hardened stainless steel such as JIS SUS630. Grades of aluminum alloy which may be used as the metal sheet 2 include, for example, aluminum alloys such as JIS 1100 and JIS 3003.

The sum of a phosphorus content in the matrix of the composite nickel-phosphorus alloy plating layer 3 as the lower layer and a phosphorus content in the $Ni_3P$ particles, exerts an important effect on hardness and brittleness of the composite nickel-phosphorus alloy plating layer 3 as the lower layer. When the sum of a phosphorus content in the matrix of the composite nickel-phosphorus alloy plating layer 3 as the lower layer and a phosphorus content in the $Ni_3P$ particles is under 1 wt. % relative to the composite nickel-phosphorus alloy plating layer 3 as the lower layer, it is impossible to cause precipitation of the $Ni_3P$ particles in an amount necessary for keeping a Vickers hardness of at least 500 Hv of the composite nickel-phosphorus alloy plating layer 3 as the lower layer. When the sum of a phosphorus content in the matrix of the composite nickel-phosphorus alloy plating layer 3 as the lower layer and a phosphorus content in the $Ni_3P$ particles is over 15 wt. % relative to the composite nickel-phosphorus alloy plating layer 3 as the lower layer, on the other hand, an internal stress of the composite nickel-phosphorus alloy plating layer 3 as the lower layer becomes larger, thus making cracks easier to occur. Therefore, the sum of a phosphorus content in the matrix of the composite nickel-phosphorus alloy plating layer 3 as the lower layer and a phosphorus content in the $Ni_3P$ particles should be limited within a range of from 1 to 15 wt. % relative to the composite nickel-phosphorus alloy plating layer 3 as the lower layer.

The content of the fluorocarbon polymer particles 4 in the composite nickel-phosphorus alloy plating layer 3 as the lower layer, exerts an important effect on strippability of the composite nickel-phosphorus alloy plated metal sheet 1 and on hardness of the composite nickel-phosphorus alloy plating layer 3 as the lower layer. When the content of the fluorocarbon polymer particles 4 in the composite nickel-phosphorus alloy plating layer 3 as the lower layer is under 0.3 wt. % (this is the value of weight percentage obtained by converting 1 vol. % on the basis of the following specific gravity of each of nickel, phosphorus and fluorocarbon polymer: nickel: 8.85, phosphorus: 1.82, and fluorocarbon polymer: 2.20), relative to the composite nickel-phosphorus plating layer 3 as the lower layer, it is impossible, even by melting the fluorocarbon polymer particles 4 which are exposed on the surface of the composite nickel-phosphorus alloy plating layer 3 as the lower layer, to form a fluorocarbon polymer layer 5 as an upper layer which covers over the entire surface of the composite nickel-phosphorus alloy plating layer 3 as the lower layer, and as a result, an excellent strippability cannot be imparted to the composite nickel-phosphorus alloy plated metal sheet 1. When the content of the fluorocarbon polymer particles 4 in the composite nickel-phosphorus alloy plating layer 3 as the lower layer is over 15.2 wt. % (this is the value of weight percentage obtained by converting 30 vol. % on the basis of the following specific gravity of each of nickel, phosphorus and fluorocarbon polymer: nickel: 8.85, phosphorus 1.82, and fluorocarbon polymer: 2.20) relative to the composite nickel-phosphorus alloy plating layer 3 as the lower layer, on the other hand, it is impossible to keep a Vickers hardness of at least 500 Hv of the composite nickel-phosphorus alloy plating layer 3 as the lower layer. Therefore, the content of the fluorocarbon polymer particles 4 in the composite nickel-phosphorus alloy plating layer 3 as the lower layer should be limited within a range of from 0.3 to 15.2 wt. % relative to the composite nickel-phosphorus alloy plating layer 3 as the lower layer.

The average particle size of the fluorocarbon polymer particles 4 in the composite nickel-phosphorus alloy plating layer 3 as the lower layer, exerts an important effect on strippability of the composite nickel-phosphorus alloy plated metal sheet 1. When the average particle size of the fluorocarbon polymer particles 4 is under 0.01 μm, the fluorocarbon polymer particles 4 tend to easily agglomerate in an electroplating bath when electroplating the metal sheet 2 to form the composite nickel-phosphorus alloy plating layer 3 as the lower layer on the surface of the metal sheet 2. It becomes difficult, as a result, to cause uniform dispersion of the fluorocarbon polymer particles 4 in the composite nickel-phosphorus alloy plating layer 3 as the lower layer, and thus an excellent strippability cannot be imparted to the composite nickel-phosphorus alloy plated metal sheet 1. When the average particle size of the fluorocarbon polymer particles 4 is over 10 μm, on the other hand, the fluorocarbon polymer particles 4 tend to easily settle in an electroplating bath when electroplating the metal sheet 2 to form the composite nickel-phosphorus alloy plating layer 3 as the lower layer on the surface of the metal sheet 2. As a result, it becomes difficult to cause uniform dispersion of the fluorocarbon polymer particles 4 in the composite nickel-phosphorus alloy plating layer 3 as the lower layer, and thus an excellent strippability cannot be imparted to the composite nickel-phosphorus alloy plated metal sheet 1. Therefore, the average particle size of the fluorocarbon polymer particles 4 in the composite nickel-phosphorus alloy plating layer 3 as the lower layer should be limited within a range of from 0.01 to 10 μm, and more preferably, within a range of from 0.05 to under 0.3 μm.

The average thickness of the composite nickel-phosphorus alloy plating layer 3 as the lower layer exerts an important effect on the protection of the metal sheet 2 against an external force and on the surface roughness of the composite nickel-phosphorus alloy plating layer 3 as the lower layer. When the average thickness of the composite nickel-phosphorus alloy plating layer 3 as the lower layer is under 0.09 μm, the metal sheet 2, the surface of which is covered by the composite nickel-phosphorus alloy plating layer 3 as the lower layer, tends to be easily damaged by an external force, thus making it impossible to sufficiently protect the metal sheet 2. When the average thickness of the composite nickel-phosphorus alloy plating layer 3 as the lower layer is over 99 μm, on the other hand, the surface roughness thereof increases when electroplating the metal sheet 2 to form the composite nickel-phosphorus alloy plating layer 3 as the lower layer on the surface of the metal sheet 2, thus degrading smoothness thereof. Therefore, the average thickness of the composite nickel-phosphorus alloy plating layer 3 as the lower layer should be limited within a range of from 0.09 to 99 μm.

The average thickness of the fluorocarbon polymer layer 5 as the upper layer exerts an important effect on strippability of the composite nickel-phosphorus alloy plated metal sheet 1 and on the quality of a printed circuit board as a product when the composite nickel-phosphorus alloy plated metal sheet 1 is used as the separating sheet in manufacturing the printed circuit board by the use of the hot press. When the average thickness of the fluorocarbon polymer layer 5 as the upper layer is under 0.01 μm, part of the surface of the composite nickel-phosphorus alloy plating layer 3 as the lower layer is exposed because of the surface roughness of the composite nickel-phosphorus alloy plating layer 3 as the lower layer, and as a result, an excellent strippability cannot be imparted to the composite nickel-phosphorus alloy plated metal sheet 1. When the average thickness of the fluorocarbon polymer layer 5 as the upper layer is over 1 μm, on the other hand, a flaw, if caused on the fluorocarbon polymer layer 5 as the upper layer, may have a depth of over 1 μm, and when the composite nickel-phosphorus alloy plated metal sheet 1 having such a deep flaw on the fluorocarbon polymer layer 5 as the upper layer is used for the manufacture of a printed circuit board by the use of the hot press, irregularities on the surface of the printed circuit board as a product are caused by such a flaw, thus degrading the quality of the printed circuit board. Therefore, the average thickness of the fluorocarbon polymer layer 5 as the upper layer should be limited within a range of from 0.01 to 1 μm.

The above-mentioned composite nickel-phosphorus alloy plated metal sheet 1 of the present invention is manufactured as follows.

First, a metal sheet 2 is electroplated in a composite nickel electroplating bath containing phosphorous acid in an amount of from 5 to 50 g/l and fluorocarbon polymer particles 4 in an amount of from 1 to 50 g/l, to form, on at least one surface of the metal sheet 2, a composite nickel-phosphorus alloy plating layer 3 as a lower layer, as shown in FIG. 2, in which the fluorocarbon polymer particles 4 are uniformly dispersed (hereinafter referred to as the "first step").

Then, the metal sheet 2 having the composite nickel-phosphorus alloy plating layer 3 as the lower layer thus formed on at least one surface of the metal sheet 2, is heated to a temperature within a range of from 325° to 400° C. for a period of time of from 10 minutes to 3 hours, to melt the fluorocarbon polymer particles 4 which are exposed on the surface of the composite nickel-phosphorus alloy plating layer 3 as the lower layer so as to form a fluorocarbon polymer layer 5 as an upper layer on the composite nickel-phosphorus alloy plating layer 3 as the lower layer; and simultaneously, at least part of nickel in the composite nickel-phosphorus alloy plating layer 3 as the lower layer is caused to react with at least part of phosphorus in the composite nickel-phosphorus alloy plating layer 3 as the lower layer to cause precipitation of $Ni_3P$ particles (hereinafter referred to as the "second step"). The thus precipitated $Ni_3P$ particles are uniformly dispersed into the composite nickel-phosphorus alloy plating layer 3 as the lower layer together with the fluorocarbon polymer particles 4.

The composite nickel-phosphorus alloy plated metal sheet 1 comprising the composite nickel-phosphorus alloy plating layer 3 as the lower layer, formed on the at least one surface of the metal sheet 2, in which the $Ni_3P$ particles and the fluorocarbon polymer particles 4 are uniformly dispersed, and the fluorocarbon polymer layer 5 as the upper layer formed on the composite nickel-phosphorus alloy plating layer 3 as the lower layer, is thus manufactured.

Any of a nickel sulfate plating solution, a nickel sulfamate plating solution, a Watt plating solution and other known plating solutions may be used as the above-mentioned composite nickel electroplating bath.

The phosphorous acid content in the composite nickel electroplating bath in the first step is limited within the above-mentioned range of from 5 to 50 g/l for the following reason: With a phosphorous acid content in the composite nickel electroplating bath of under 5 g/l, it is impossible to cause precipitation of the $Ni_3P$ particles in an amount necessary for keeping a Vickers hardness of at least 500 Hv of the composite nickel-phosphorus alloy plating layer 3 as the lower layer. With a phosphorous acid content in the composite nickel electroplating bath of over 50 g/l, on the other hand, a plating electric current efficiency is degraded.

The content of the fluorocarbon polymer particles 4 in the composite nickel electroplating bath in the first step, is limited within the above-mentioned range of from 1 to 50 g/l for the following reason: With a content of the fluorocarbon polymer particles 4 in the composite nickel electroplating bath of under 1 g/l, it is impossible to form the fluorocarbon polymer layer 5 as the upper layer, which covers over the entire surface of the composite nickel-phosphorus alloy plating layer 3 as the lower layer, even by melting the fluorocarbon polymer particles 4 exposed on the surface of the composite nickel-phosphorus alloy plating layer 3 as the lower layer, and as a result, an excellent strippability cannot be imparted to the composite nickel-phosphorus alloy plated metal sheet 1. With a content of the fluorocarbon polymer particles 4 in the composite nickel electroplating bath of over 50 g/l, on the other hand, the quantity of the fluorocarbon polymer particles 4 dispersed into the composite nickel-phosphorus alloy plating layer 3 as the lower layer becomes excessive, resulting in impossibility of maintenance of a Vickers hardness of at least 500 Hv of the composite nickel-phosphorus alloy plating layer 3 a the lower layer.

The heating temperature of the metal sheet 2 having the composite nickel-phosphorus alloy plating layer 3 as the lower layer formed on at least one surface thereof in the second step, is limited within the above-mentioned range of from 325° to 400° C., and the heating period of time, within the above-mentioned range of from 10 minutes to 3 hours for the following reasons: With a heating temperature of the metal sheet 2 of under 325° C. and with a heating period of time thereof of under 10 minutes, it is impossible to sufficiently melt the fluorocarbon polymer particles 4 which are exposed on the surface of the composite nickel-phosphorus alloy plating layer 3 as the lower layer, and as a result, an excellent strippability cannot be imparted to the composite nickel-phosphorus alloy plated metal sheet 1. It is furthermore impossible to cause at least part of nickel in the composite nickel-phosphorus alloy plating layer 3 as the lower layer to react with at least part of phosphorus in the composite nickel-phosphorus alloy plating layer 3 as the lower layer to cause precipitation of the $Ni_3P$ particles, and as a result, it is impossible to keep a Vickers hardness of at least 500 Hv of the composite nickel-phosphorus alloy plating layer 3 as the lower layer. With a heating temperature of the metal sheet 2 of over 400° C. and with a heating period of time thereof of over 3 hours, on the other hand, the fluorocarbon polymer is denatured, and as a result, an excellent strippability cannot be imparted to the composite nickel-phosphorus alloy plated metal sheet 1. In addition, nickel crystal grains in the composite nickel-phosphorus alloy plating layer 3 as the lower layer become coarser, and as a result, it is impossible to keep a Vickers hardness of at least 500 Hv of the composite nickel-phosphorus alloy plating layer 3 as the lower layer.

Now, the method of the present invention for manufacturing a composite nickel-phosphorus alloy plated metal sheet is described in more detail by mean of examples while comparing with cases for comparison.

EXAMPLE 1

A sheet of ordinary structural steel specified in JIS SS41, having a thickness of 10 mm, was used as the metal sheet. The steel sheet was subjected to a known decreasing treatment and a known pickling treatment to remove rust from the both surfaces thereof. Then, after the removal of rust, the steel sheet was electroplated under the following conditions:

| | |
|---|---|
| (1) Chemical composition of composite nickel electroplating bath: | |
| Nickel sulfate | 240 g/l, |
| Nickel chloride | 45 g/l, |
| Boric acid | 30 g/l, |
| Phosphorous acid | 10 g/l, and |
| Polytetrafluoroethylene particles (average particle size: 0.2 μm) as fluorocarbon polymer | 30 g/l, |
| (2) Electric current density | 1.5 A/dm², |
| (3) Bath temperature | 55° C., |
| (4) pH value | 2.0, |
| (5) Electroplating time | 20 minutes, | to form, on each of the both surfaces of the steel sheet, a composite nickel-phosphorus alloy plating layer as a lower layer, having an average thickness of 10 μm, in which the fluorocarbon polymer particles were uniformly dispersed.

Then, the steel sheet having the composite nickel-phosphorus alloy plating layer as the lower layer formed on each of the both surfaces thereof, was heated at a temperature of 360° C. for one hour to melt the fluorocarbon polymer particles which were exposed on the surface of each of the composite nickel-phosphorus alloy plating layers as the lower layers to form a fluorocarbon polymer layer as an upper layer, having an average thickness of about 0.1 μm, on each of the composite nickel-phosphorus alloy plating layers as the lower layers, thereby preparing a sample of the present invention No. 1.

Regarding the sample of the present invention No. 1, the following facts were observed:

(1) A satisfactory adhesion was ensured between the steel sheet and the composite nickel-phosphorus alloy plating layer as the lower layer, and between the composite nickel-phosphorus alloy plating layer as the lower layer and the fluorocarbon polymer layer as the upper layer;

(2) The $Ni_3P$ particles and the fluorocarbon polymer particles were uniformly dispersed in the composite nickel-phosphorus alloy plating layer as the lower layer;

(3) The composite nickel-phosphorus alloy plating layer as the lower layer had no cracks;

(4) The matrix of the composite nickel-phosphorus alloy plating layer as the lower layer and the $Ni_3P$ particles had a total content of phosphorus of 5 wt. % relative to the composite nickel-phosphorus alloy plating layer as the lower layer;

(5) The composite nickel-phosphorus alloy plating layer as the lower layer had a content of the fluorocarbon polymer particles of 7 wt. % (this is the value of weight percentage obtained by converting 20 vol. % on the basis of the following specific gravity of each of nickel, phosphorus and fluorocarbon polymer: nickel: 8.85, phosphorus: 1.82, and fluorocarbon polymer: 2.20); and (6) The sample of the present invention No. 1 had a Vickers hardness of 500 Hv.

Then, the sample of the present invention No. 1 was tested for strippability by using same as a separating sheet when manufacturing a printed circuit board by the use of a hot press as follows:

First, a sheet of the sample of the present invention No. 1, a sheet of copper foil having a thickness of 50 μm, a sheet of a prepreg having a thickness of 50 μm, a substrate sheet made of epoxy resin having a thickness of 0.5 mm, and another sheet of the sample of the present invention No. 1 were placed one on the top of the other in this order to prepare a set of laminated sheets. The thus prepared set of laminated sheets was put on a hot press and was pressed for 5 minutes at a temperature of 175° C. As a result, the substrate sheet and the copper foil were firmly bonded together by the epoxy resin impregnated in the prepreg. Although part of the epoxy resin between the substrate sheet and the copper foil was forced out from the edges of these sheets and adhered onto the surface of the sample of the present invention No. 1, most of the adhering epoxy resin was very easily stripped off from the surface of the sample of the present invention No. 1 without the use of a metallic spatula or a knife. Part of the epoxy resin still remaining on the surface of the sample of the present invention No. 1 without being stripped off, was easily removed by the use of a metallic spatula or a knife. No flaw was caused at all on the composite nickel-phosphorus alloy plating layer as the lower layer by the use of the spatula or the knife.

EXAMPLE 2

A sheet of austenitic stainless steel specified in JIS SUS201, having a thickness of 1 mm, was used as the metal sheet. The stainless steel sheet was subjected to a known degreasing treatment and a known electrolytic pickling treatment, and furthermore, to a nickel strike plating as a pretreatment in a nickel chloride plating bath. Then, the thus pretreated stainless steel sheet was electroplated under the following conditions:

| (1) Chemical composition of composite nickel electroplating bath: | |
|---|---|
| Nickel sulfate | 240 g/l, |
| Nickel chloride | 45 g/l, |
| Boric acid | 30 g/l, |
| phosphoruos acid | 35 g/l, and |
| Polytetrafluoroethylene particles (average particle size: 0.2 μm) as fluorocarbon polymer | 30 g/l, |
| (2) Electric current density | 1.5 A/dm$^2$, |
| (3) Bath temperature | 55° C. |
| (4) pH value | 2.0, |
| (5) Electroplating time | 20 minutes, | to form, on each of the both surfaces of the stainless steel sheet, a composite nickel-phosphorus alloy plating layer as a lower layer, having an average thickness of 10 μm, in which the fluorocarbon polymer particles were uniformly dispersed.

Then, the stainless steel sheet having the composite nickel-phosphorus alloy plating layer as the lower layer formed on each of the both surfaces thereof, was heated at a temperature of 360° C. for one hour to melt the fluorocarbon polymer particles which were exposed on the surface of each of the composite nickel-phosphorus alloy plating layers as the lower layers to form a fluorocarbon polymer layer as an upper layer, having an average thickness of about 0.1 μm, on each of the composite nickel-phosphorus alloy plating layers as the lower layers, thereby preparing a sample of the present invention No. 2.

Regarding the sample of the present invention No. 2, the following facts were observed:
(1) A satisfactory adhesion was ensured between the stainless steel sheet and the composite nickel-phosphorus alloy plating layer as the lower layer, and between the composite nickel-phosphorus alloy plating layer as the lower layer and the fluorocarbon polymer layer as the upper layer;
(2) The Ni$_3$P particles and the fluorocarbon polymer particles were uniformly dispersed in the composite nickel-phosphorus alloy plating layer as the lower layer;
(3) The composite nickel-phosphorus alloy plating layer as the lower layer had no cracks;
(4) The matrix of the composite nickel-phosphorus alloy plating layer as the lower layer and the Ni$_3$P particles had a total content of phosphorus of 10 wt. % relative to the composite nickel-phosphorus alloy plating layer as the lower layer;
(5) The composite nickel-phosphorus alloy plating layer as the lower layer had a content of the fluorocarbon polymer particles of 8.1 wt. % (this is the value of weight percentage obtained by converting 20 vol. % on the basis of the following specific gravity of each of nickel, phosphorus and fluorocarbon polymer: nickel: 8.85, phosphorus: 1.82, and fluorocarbon polymer: 2.20); and
(6) The sample of the present invention No. 2 had a Vickers hardness of 600 Hv.

Then, the sample of the present invention No. 2 was tested for strippability in the same manner as in the sample of the present invention No. 1. As a result, most of the epoxy resin adhering onto the surface of the sample of the present invention No. 2 was very easily stripped off from the surface of the sample of the present invention No. 2 without the use of a metallic spatula or a knife. Part of the epoxy resin still remaining on the surface of the sample of the present invention No. 2 without being stripped off, was easily removed by the use of a metallic spatula or a knife. No flaw was caused at all on the composite nickel-phosphorus alloy plating layer as the lower layer by the use of the spatula or the knife.

EXAMPLE 3

A sheet of aluminum alloy specified in JIS 1100, having a thickness of 1 mm, was used as the metal sheet. The aluminum alloy sheet was subjected to a known degreasing treatment, a known etching treatment by the use of a caustic soda solution, and a known smut removing treatment. In addition, the aluminum alloy sheet was subjected to a nickel strike plating as a pretreatment in a nickel chloride plating bath. Then the thus treated alloy sheet was electroplated under the same conditions as the plating conditions in Example 2 to form, on each of the both surfaces of the aluminum alloy sheet, a composite nickel-phosphorus alloy plating layer, as a lower layer having an average thickness of 10 μm, in which the fluorocarbon polymer particles were uniformly dispersed.

Then, the aluminum alloy sheet having the composite nickel-phosphorus alloy plating layer as the lower layer thus formed on each of the both surfaces thereof, was heated at a temperature of 360° C. for one hour to melt the fluorocarbon polymer particles which were exposed on the surface of each of the composite nickel-phosphorus alloy plating layers as the lower layers to form a fluorocarbon polymer layer as an upper layer, having an average thickness of about 0.1 μm, on each of the composite nickel-phosphorus alloy plating layers as the lower layers, thereby preparing a sample of the present invention No. 3.

Regarding the sample of the present invention No. 3, the following facts were observed:
(1) A satisfactory adhesion was ensured between the aluminum alloy sheet and the composite nickel-phosphorus alloy plating layer as the lower layer, and between the composite nickel-phosphorus alloy plating layer as the lower layer and the fluorocarbon polymer layer as the upper layer;
(2) The Ni$_3$P particles and the fluorocarbon polymer particles were uniformly dispersed in the composite nickel-phosphorus alloy plating layer as the lower layer;
(3) The composite nickel-phosphorus alloy plating layer as the lower layer had no cracks;
(4) The matrix of the composite nickel-phosphorus alloy plating layer as the lower layer and the Ni$_3$P particles had a total content of phosphorus of 10 wt. % relative to the composite nickel-phosphorus alloy plating layer as the lower layer
(5) The composite nickel-phosphorus alloy plating layer as the lower layer had a content of the fluorocarbon polymer particles of 8.1 wt. % (this is the value of weight percentage obtained by converting 20 vol. % on the basis of the following specific gravity of each of nickel, phosphorus and fluorocarbon polymer: nickel: 8.85, phosphorus: 1.82, and fluorocarbon polymer: 2.20); and (6) The sample of the present invention No. 3 had a Vickers hardness of 600 Hv.

Then, the sample of the present invention No. 3 was tested for strippability in the same manner as in the sample of the present invention No. 1. As a result, most of the epoxy resin adhering onto the surface of the sample of the present invention No. 3 was very easily stripped off from the surface of the sample of the present invention No. 3 without the use of a metallic spatula or a knife. Part of the epoxy resin still remaining on the surface of the sample of the present invention No. 3 without being stripped off, was easily removed by the use of a metallic spatula or a knife. No flaw was caused at all on the composite nickel-phosphorus alloy plating layer as the lower layer by the use of the spatula or the knife.

EXAMPLE FOR COMPARISON 1

A sheet of the same steel as in Example 1 was subjected to a known degreasing treatment and a known pickling treatment to remove rust from the both surfaces thereof. Then, after the removal of rust, the steel sheet was electroplated under the same conditions as the plating conditions in Example 1, except for a phosphorous acid content in the composite nickel electroplating bath of 1 g/l, which was lower than the lower limit of the phosphorous acid content in the method of the present invention to form, on each of the both surfaces of the steel sheet, a composite nickel-phosphorus alloy plating layer as a lower layer, having an average thickness of 10 μm, in which the fluorocarbon polymer particles were uniformly dispersed.

Then, the steel sheet having the composite nickel-phosphorus alloy plating layer as the lower layer formed on each of the both surfaces thereof, was heated, as in Example 1, at a temperature of 360° C. for one hour to melt the fluorocarbon polymer particles which were exposed on the surface of each of the composite nickel-phosphorus alloy plating layers as the lower layers to form a fluorocarbon polymer layer as an upper layer, having an average thickness of about 0.1 μm, on each of the composite nickel-phosphorus alloy plating layers as the lower layers, thereby preparing a sample for comparison No. 1 outside the scope of the present invention.

Since the composite nickel electroplating bath for preparing the sample for comparison No. 1 had a phosphorous acid content of 1 g/l, which was lower than the lower limit of the phosphorous acid content in the method of the present invention, the following differences between the sample for comparison No. 1 and the sample of the present invention No. 1 were observed:

(1) The matrix of the composite nickel-phosphorus alloy plating layer as the lower layer and the Ni$_3$P particles of the sample for comparison No. 1 had a total content of phosphorus of 0.5 wt. % relative to the composite nickel-phosphorus alloy plating layer as the lower layer, which was lower than the lower limit of the total content of phosphorus in the matrix of the composite nickel-phosphorus alloy plating layer as the lower layer and the Ni$_3$P particles of the present invention; and (2) The sample for comparison No. 1 had a Vickers hardness of 250 Hv which was lower than the Vickers hardness of the sample of the present invention No. 1.

Then, the sample for comparison No. 1 was tested for strippability in the same manner as in the sample of the present invention No. 1. Since the composite nickel electroplating bath for preparing the sample for comparison No. 1 had a phosphorous acid content of 1 g/l, which was lower than the lower limit of the phosphorous acid content in the method of the present invention, the sample for comparison No. 1 had the following problem: Although part of the epoxy resin still remaining on the surface of the sample for comparison No. 1 without being stripped off, was easily removed by the use of a metallic spatula or a knife, flaws caused by the spatula or the knife were observed on the composite nickel-phosphorus alloy plating layer as the lower layer.

EXAMPLE FOR COMPARISON 2

A sheet of the same steel as in Example 1 was subjected to a known degreasing treatment and a known pickling treatment to remove rust from the both surfaces thereof. Then, after the removal of rust, the steel sheet was electroplated under the same conditions as the plating conditions in Example 1, except for a phosphorous acid content in the composite nickel electroplating bath of 70 g/l, which was higher than the upper limit of the phosphorous acid content in the method of the present invention, to form, on each of the both surfaces of the steel sheet, a composite nickel-phosphorus alloy plating layer as a lower layer, having an average thickness of 10 μm, in which the fluorocarbon polymer particles were uniformly dispersed.

Then, the steel sheet having the composite nickel-phosphorus alloy plating layer as the lower layer formed on each of the both surfaces thereof, was heated, as in Example 1, at a temperature of 360° C. for one hour to melt the fluorocarbon polymer particles which were exposed on the surface of each of the composite nickel-phosphorus alloy plating layer as the lower layer to form a fluorocarbon polymer layer as an upper layer, having an average thickness of about 0.1 μm, on each of the composite nickel-phosphorus alloy plating layers as the lower layers, thereby preparing a sample for comparison No. 2 outside the scope of the present invention.

Since the composite nickel electroplating bath for preparing the sample for comparison No. 2 had a phosphorous acid content of 70 g/l, which was higher than the upper limit of the phosphorous acid content in the method of the present invention, the following differences between the sample for comparison No. 2 and the sample of the present invention No. 1 were observed:

(1) The matrix of the composite nickel-phosphorus alloy plating layer as the lower layer and the Ni$_3$P particles of the sample for comparison No. 2 had a total content of phosphorus of 18 wt. %, relative to the composite nickel-phosphorus alloy plating layer as the lower layer, which was higher than the upper limit of the total content of phosphorus in the matrix of the composite nickel-phosphorus alloy plating layer as the lower layer and the Ni$_3$P particles of the present invention; and (2) The composite nickel-phosphorus alloy plating layer as the lower layer of the sample for comparison No. 2 had cracks.

Since the composite nickel-phosphorus alloy plating layer as the lower layer of the sample for comparison No. 2 had cracks, the sample for comparison No. 2 was unsuitable as a separating sheet to be used when manufacturing a printed circuit board by the use of a hot press.

EXAMPLE FOR COMPARISON 3

A sheet of the same stainless steel as in Example 2 was subjected to a known degreasing treatment and a known electrolytic pickling treatment, and furthermore, to a nickel strike plating as a pretreatment in a nickel chloride plating bath. Then, the thus pretreated stainless steel sheet was electroplated under the same conditions as the plating conditions in Example 2, except for a content of the fluorocarbon polymer particles in the composite nickel electroplating bath of 0.5 g/l, which was lower than the lower limit of the content of the fluorocarbon polymer particles in the method of the present invention, to form, on each of the both surfaces of the stainless steel sheet, a composite nickel-phosphorus alloy plating layer as a lower layer, having an average thickness of 10 $\mu$m, in which the fluorocarbon polymer particles were uniformly dispersed.

Then the stainless steel sheet having the composite nickel-phosphorus alloy plating layer as the lower layer formed on each of the both surfaces thereof, was heated, as in Example 2, at a temperature of 360° C. for one hour to melt the fluorocarbon polymer particles which were exposed on the surface of each of the composite nickel-phosphorus alloy plating layers as the lower layers to form a fluorocarbon polymer layer as an upper layer on each of the composite nickel-phosphorus alloy plating layers as the lower layers, thereby preparing a sample for comparison No. 3 outside the scope of the present invention.

Since the composite nickel electroplating bath for preparing the sample for comparison No. 3 had a content of the fluorocarbon polymer particles of 0.5 g/l, which was lower than the lower limit of the content of the fluorocarbon polymer particles in the method of the present invention, the following differences between the sample for comparison No. 3 and the sample of the present invention No. 2 were observed:

(1) The fluorocarbon polymer layer as the upper layer of the sample for comparison No. 3 did not cover the entire surface of the composite nickel-phosphorus alloy plating layer as the lower layer, so that the composite nickel-phosphorus alloy plating layer as the lower layer was partly exposed; and (2) The composite nickel-phosphorus alloy plating layer as the lower layer of the sample for comparison No. 3, had a content of the fluorocarbon polymer particles of 0.1 wt. %, relative to the composite nickel-phosphorus alloy plating layer as the lower layer, which was lower than the lower limit of the content of the fluorocarbon polymer particles in the composite nickel-phosphorus alloy plating layer as the lower layer of the present invention.

Then, the sample for comparison No. 3 was tested for strippability in the same manner as in the sample of the present invention No. 1. Since the composite nickel electroplating bath for preparing the sample for comparison No. 3 had a content of the fluorocarbon polymer particles of 0.5 g/l, which was lower than the lower limit of the content of the fluorocarbon polymer particles in the method of the present invention, it was very difficult to remove the epoxy resin adhering onto the surface of the sample for comparison No. 3 even with the use of a metallic spatula or a knife.

EXAMPLE FOR COMPARISON 4

A sheet of the same stainless steel as in Example 2 was subjected to a known degreasing treatment and a known electrolytic pickling treatment, and furthermore, to a nickel strike plating as a pretreatment in a nickel chloride plating bath. Then, the thus pretreated stainless steel sheet was electroplated under the same conditions as the plating conditions in Example 2, except for a content of the fluorocarbon polymer particles in the composite nickel electroplating bath of 70 g/l, which was higher than the upper limit of the content of the fluorocarbon polymer particles in the method of the present invention, to form, on each of the both surfaces of the stainless steel sheet, a composite nickel-phosphorus alloy plating layer as a lower layer, having an average thickness of 10 $\mu$m, in which the fluorocarbon polymer particles were uniformly dispersed.

Then, the stainless steel sheet having the composite nickel-phosphorus alloy plating layer as the lower layer formed on each of the both surfaces thereof, was heated, as in Example 2, at a temperature of 360° C. for one hour to melt the fluorocarbon polymer particles which were exposed on the surface of each of the composite nickel-phosphorus alloy plating layers as the lower layers to form a fluorocarbon polymer layer as an upper layer, having an average thickness of about 0.15 mm, on each of the composite nickel-phosphorus alloy plating layers as the lower layers, thereby preparing a sample for comparison No. 4 outside the scope of the present invention.

Since the composite nickel electroplating bath for preparing the sample for comparison No. 4 had a content of the fluorocarbon polymer particles of 70 g/l, which was higher than the upper limit of the content of the fluorocarbon polymer particles in the method of the present invention, the following differences between the sample for comparison No. 4 and the sample of the present invention No. 2 were observed:

(1) The composite nickel-phosphorus alloy plating layer as the lower layer of the sample for comparison No. 4, had a content of the fluorocarbon polymer particles of 20 wt. %, relative to the composite nickel-phosphorus alloy plating layer as the lower layer, which was higher than the upper limit of the content of the fluorocarbon polymer particles in the composite nickel-phosphorus alloy plating layer as the lower layer of the present invention; and (2) The sample for comparison No. 4 had a Vickers hardness of 350 Hv, which was lower than the Vickers hardness of the sample of the present invention No. 2.

Then, the sample for comparison No. 4 was tested for strippability in the same manner as in the sample of the present invention No. 1. Since the composite nickel electroplating bath for preparing the sample for comparison No. 4 had a content of the fluorocarbon polymer particles of 70 g/l, which was higher than the upper limit of the content of the fluorocarbon polymer particles in the method of the present invention, the sample for comparison No. 4 had the following problem: Although most of the epoxy resin adhering onto the surface of the sample for comparison No. 4 was very easily stripped off, flaws were produced on the composite nickel-phosphorus alloy plating layer as the lower layer when removing part of the epoxy resin still remaining of the surface of the sample for comparison No. 4 without being stripped off, by the use of a metallic spatula of a knife.

EXAMPLE FOR COMPARISON 5

A sheet of the same aluminum alloy as in Example 3 was subjected to a known degreasing treatment, a known etching treatment by the use of a caustic soda solution, and a known smut removing treatment. In addition, the aluminum alloy sheet was subjected to a nickel strike plating as a pretreatment in a nickel chloride plating bath. Then, the thus treated aluminum alloy sheet was electroplated under the same conditions as the plating conditions in Example 2, except for a phosphorous acid content in the composite nickel electroplating bath of 1 g/l, which was lower than the lower limit of the phosphorous acid content in the method of the present invention, and a content of the fluorocarbon polymer particles in the composite nickel electroplating bath of 0.5 g/l, which was lower than the lower limit of the content of the fluorocarbon polymer particles in the method of the present invention, to form, on each of the both surfaces of the aluminum alloy sheet, a composite nickel-phosphorus alloy plating layer as a lower layer, having an average thickness of 10 $\mu$m, in which the fluorocarbon polymer particles were uniformly dispersed.

Then, the aluminum alloy sheet having the composite nickel-phosphorus alloy plating layer as the lower layer formed on each of the both surfaces thereof, was heated, as in Example 2, at a temperature of 360° C. for one hour to melt the fluorocarbon polymer particles which were exposed on the surface of each of the composite nickel-phosphorus alloy plating layers as the lower layers to form a fluorocarbon polymer layer as an upper layer on each of the composite nickel-phosphorus alloy plating layers as the lower layers, thereby preparing a sample for comparison No. 5 outside the scope of the present invention.

Since the composite nickel electroplating bath for preparing the sample for comparison No. 5 had a phosphorous acid content of 1 g/l, which was lower than the lower limit of the phosphorous acid content in the method of the present invention, and a content of the fluorocarbon polymer particles of 0.5 g/l, which was lower than the lower limit of the content of the fluorocarbon polymer particles in the method of the present invention, the following differences between the sample for comparison No. 5 and the sample of the present invention No. 3 were observed.

(1) The matrix of the composite nickel-phosphorus alloy plating layer as the lower layer and the $Ni_3P$ particles of the sample for comparison No. 5, had a total content of phosphorus of 0.5 wt. %, relative to the composite nickel-phosphorus alloy plating layer as the lower layer, which was lower than the lower limit of the total content of phosphorus in the matrix of the composite nickel-phosphorus alloy plating layer as the lower layer and the $Ni_3P$ particles of the present invention;

(2) The fluorocarbon polymer layer as the upper layer of the sample for comparison No. 5 did not cover the entire surface of the composite nickel-phosphorus alloy plating layer as the lower layer, so that the composite nickel-phosphorus alloy plating layer as the lower layer was partly exposed;

(3) The composite nickel-phosphorus alloy plating layer as the lower layer of the sample for comparison No. 5, had a content of the fluorocarbon polymer particles of 0.1 wt. %, relative to the composite nickel-phosphorus alloy plating layer as the lower layer, which was lower than the lower limit of the content of the fluorocarbon polymer particles in the composite nickel-phosphorus alloy plating layer as the lower layer of the present invention; and (4) The sample for comparison No. 5 had a Vickers hardness of 250 Hv, which was lower than the Vickers hardness of the sample of the present invention No. 3.

Then, the sample for comparison No. 5 was tested for strippability in the same manner as in the sample of the present invention No. 1. Since the composite nickel electroplating bath for preparing the sample for comparison No. 5 had a phosphorous acid content of 1 g/l, which was lower than the lower limit of the phosphorous acid content in the method of the present invention, and a content of the fluorocarbon polymer particles of 0.5 g/l, which was lower than the lower limit of the content of the fluorocarbon polymer particles in the method of the present invention, the sample for comparison No. 5 had the following problem: it was very difficult to remove the epoxy resin adhering onto the surface of the sample for comparison No. 5 even with the use of a metallic spatula or a knife, and in addition, flaws were produced on the composite nickel-phosphorus alloy plating layer as the lower layer when removing part of the epoxy resin still remaining on the surface of the sample for comparison No. 5 by the use of the spatula or the knife.

EXAMPLE FOR COMPARISON 6

A sheet of the same aluminum alloy as in Example 3 was subjected to a known degreasing treatment, a known etching treatment by the use of a caustic soda solution, and a known smut removing treatment. In addition, the aluminum alloy sheet was subjected to a nickel strike plating as a pretreatment in a nickel chloride plating bath. Then, the thus treated aluminum alloy sheet was electroplated under the same conditions as the plating conditions in Example 2, except for a phosphorous acid content in the composite nickel electroplating bath of 70 g/l, which was higher than the upper limit of the phosphorous acid content in the method of the present invention, and a content of the fluorocarbon polymer particles in the composite nickel electroplating bath of 70 g/l, which was higher than the upper limit of the content of the fluorocarbon polymer particles in the method of the present invention, to form, on each of the both surfaces of the aluminum alloy sheet, a composite nickel-phosphorus alloy plating layer as a lower layer, having an average thickness of 10 $\mu$m, in which the fluorocarbon polymer particles were uniformly dispersed.

Then, the aluminum alloy sheet having the composite nickel-phosphorus alloy plating layer as the lower layer formed on each of the both surfaces thereof, was heated, as in Example 2, at a temperature of 360° C. for one hour to melt the fluorocarbon polymer particles which were exposed on the surface of each of the composite nickel-phosphorus alloy plating layers as the lower layers to form a fluorocarbon polymer layer as an upper layer on each of the composite nickel-phosphorus alloy plating layers as the lower layers, having an average thickness of about 0.15 mm, thereby preparing a sample for comparison No. 6 outside the scope of the present invention.

Since the composite nickel electroplating bath for preparing the sample for comparison No. 6 had a phosphorous acid content of 70 g/l, which was higher than the upper limit of the phosphorous acid content in the method of the present invention, and a content of the fluorocarbon polymer particles of 70 g/l, which was higher than the upper limit of the content of the fluorocarbon polymer particles in the method of the present invention, the following differences between the sample for comparison No. 6 and the sample of the present invention No. 3 were observed:

(1) The matrix of the composite nickel-phosphorus alloy plating layer as the lower layer and the $Ni_3P$ particles of the sample for comparison No. 6, had a total content of phosphorus of 18 wt. %, relative to the composite nickel-phosphorus alloy plating layer as the lower layer, which was higher than the upper limit of the total content of phosphorus in the matrix of the composite nickel-phosphorus alloy plating layer as the lower layer and the $Ni_3P$ particles of the present invention;

(2) The composite nickel-phosphorus alloy plating layer as the lower layer of the sample for comparison No. 6 had cracks;

(3) The composite nickel-phosphorus alloy plating layer as the lower layer of the sample for comparison No. 6, had a content of the fluorocarbon polymer particles of 20 wt. %, relative to the composite nickel-phosphorus alloy plating layer as the lower layer, which was higher than the upper limit of the content of the fluorocarbon polymer particles in the composite nickel-phosphorus alloy plating layer as the lower layer of the present invention; and (4) The sample for comparison No. 6 had a Vickers hardness of 350 Hv, which was lower than the Vickers hardness of the sample of the present invention No. 3.

Then, the sample for comparison No. 6 was tested for strippability in the same manner as in the sample of the present invention No. 1. Since the composite nickel electroplating bath for preparing the sample for comparison No. 6 had a phosphorous acid content of 70 g/l, which was higher than the upper limit of the phosphorous acid content in the method of the present invention, and a content of the fluorocarbon polymer particles of 70 g/l, which was higher than the upper limit of the content of the fluorocarbon polymer particles in the method of the present invention, the sample for comparison No. 6 had the following problem: Although most of the epoxy resin adhering onto the surface of the sample for comparison No. 6 was very easily stripped off, flaws were produced on the composite nickel-phosphorus alloy plating layer as the lower layer when removing part of the epoxy resin still remaining on the surface of the sample for comparison No. 6 without being stripped off, by the use of a metallic spatula or a knife.

According to the present invention, as described above in detail, it is possible to obtain a composite nickel-phosphorus alloy plated metal sheet excellent in strippability and having a Vickers hardness of at least 500 Hv, which is most suitable as a separating sheet to be used when manufacturing a printed circuit board by the use of a hot press, and a method for manufacturing same, thus providing many industrially useful effect.

What is claimed is:

1. A composite nickel-phosphorus alloy plated metal sheet excellent in strippability and having a Vickers hardness of at least 500 Hv, which comprises:
   a composite nickel-phosphorus alloy mating plating layer formed on at least one surface of a metal sheet, in which $Ni_3P$ particles and fluorocarbon polymer particles are uniformly dispersed, the sum of a phosphorus content in the matrix of said composite nickel-phosphorus alloy plating layer and a phosphorus content in said $Ni_3P$ particles being within a range of from 1 to 15 wt. % relative to said composite nickel-phosphorus alloy plating layer and a content of said fluorocarbon polymer particles in said composite nickel-phosphorus alloy plating layer being within a range of from 0.3 to 15.2 wt. % relative to said composite nickel-phosphorus alloy plating layer; and
   a fluorocarbon polymer layer formed on said composite nickel-phosphorus alloy plating layer by melting said fluorocarbon polymer particles which are exposed on the surface of said composite nickel-phosphorus alloy plating layer.

2. A composite nickel-phosphorus alloy plated metal sheet as claimed in claim 1, wherein:
   said metal sheet comprises steel or an aluminum alloy.

3. A composite nickel-phosphorus alloy plated metal sheet as claimed in claim 1, wherein:
   said fluorocarbon polymer particles in said composite nickel-phosphorus alloy plating layer have an average particle size within a range of from 0.01 to 10 μm.

4. A composite nickel-phosphorus alloy plated metal sheet as claimed in claim 3, wherein:
   said fluorocarbon polymer particles in said composite nickel-phosphorus alloy plating layer have an average particle size within a range of from 0.05 to under 0.3 μm.

5. A composite nickel-phosphorus alloy plated metal sheet as claimed in claim 1, wherein:
   said composite nickel-phosphorus alloy plating layer has an average thickness within a range of from 0.09 to 99 μm.

6. A composite nickel-phosphorus alloy plated metal sheet as claimed in claim 1, wherein:
   said fluorocarbon polymer layer has an average thickness within a range of from 0.01 to 1 μm.

7. A method for manufacturing a composite nickel-phosphorus alloy plated metal sheet excellent in strippability and having a Vickers hardness of at least 500 Hv, which comprises the steps of:
   electroplating a metal sheet in a composite nickel electroplating bath containing phosphorous acid in an amount of from 5 to 50 g/l and fluorocarbon polymer particles in an amount of from 1 to 50 g/l, to form, on at least one surface of said metal sheet, a composite nickel-phosphorus alloy plating layer in which said fluorocarbon polymer particles are uniformly dispersed; and then
   heating said metal sheet having said composite nickel-phosphorus alloy plating layer thus formed on said at least one surface of said metal sheet to a temperature within a range of from 325° to 400° C. for a period of time of from 10 minutes to 3 hours, to melt said fluorocarbon polymer particles which are exposed on a surface of said composite nickel-phosphorus alloy plating layer so as to form a fluorocarbon polymer layer on said composite nickel-phosphorus alloy plating layer and simultaneously, to cause at least part of nickel in said composite nickel-phosphorus alloy plating layer to react with at least part of phosphorus in said composite nickel-phosphorus alloy plating layer to cause precipitation of $Ni_3P$ particles so as to uniformly disperse the thus precipitated $Ni_3P$ particles together with said fluorocarbon polymer particles into said composite nickel-phosphorus alloy plating layer thereby manufacturing said composite nickel-phosphorus alloy plated metal sheet comprising said composite nickel-phosphorus alloy plating layer formed on said at least one surface of said metal sheet, in which said $Ni_3P$ particles and said fluorocarbon polymer particles are uniformly dispersed, and said fluorocarbon polymer layer formed on said composite nickel-phosphorus alloy plating layer.

* * * * *